(12) United States Patent
Lin (10) Patent No.: US 8,464,779 B2
(45) Date of Patent: Jun. 18, 2013

(54) HEAT RADIATING FIN ASSEMBLY AND THERMAL MODULE FORMED THEREFROM

(75) Inventor: Sheng-Huang Lin, Sinjhuang (TW)

(73) Assignee: Beijing AVC Technology Research Center Co., Ltd., Beijijng (CN)

( * ) Notice: Subject to any disclaimer, the term of this patent is extended or adjusted under 35 U.S.C. 154(b) by 150 days.

(21) Appl. No.: 12/321,002

(22) Filed: Jan. 14, 2009

(65) Prior Publication Data
US 2010/0124021 A1 May 20, 2010

(30) Foreign Application Priority Data

Nov. 18, 2008 (TW) ................................ 97220652 U (51) Int. Cl.
*F28F 7/00* (2006.01)
*F28D 7/04* (2006.01)
*H05K 7/20* (2006.01)

(52) U.S. Cl.
USPC ............. 165/80.3; 165/78; 165/151; 361/704

(58) Field of Classification Search
USPC ..................... 165/80.3, 78, 151, 185; 361/704
See application file for complete search history.

(56) References Cited

U.S. PATENT DOCUMENTS

| | | | |
|---|---|---|---|
| 5,558,155 A | 9/1996 | Ito | |
| 6,273,186 B1 * | 8/2001 | Ognibene et al. | 165/185 |
| 6,382,307 B1 * | 5/2002 | Wang et al. | 165/80.3 |
| 7,188,663 B2 * | 3/2007 | Lin | 165/104.33 |
| 8,210,242 B2 * | 7/2012 | Li et al. | 165/80.3 |
| 8,225,846 B2 * | 7/2012 | Lin | 165/80.3 |
| 2005/0073811 A1 * | 4/2005 | Wang et al. | 361/688 |
| 2005/0286232 A1 * | 12/2005 | Chen et al. | 361/710 |
| 2007/0006997 A1 * | 1/2007 | Hsieh | 165/104.33 |
| 2007/0295487 A1 * | 12/2007 | Xia et al. | 165/104.33 |
| 2008/0047693 A1 * | 2/2008 | Chen | 165/104.33 |
| 2008/0105408 A1 * | 5/2008 | Zhang et al. | 165/104.33 |
| 2009/0139692 A1 * | 6/2009 | Lin | 165/80.3 |

FOREIGN PATENT DOCUMENTS

JP          62052398 A    *    3/1987

OTHER PUBLICATIONS

English Abstract for JP62052398A.*

* cited by examiner

*Primary Examiner* — Brandon M Rosati (57) ABSTRACT

A heat radiating fin assembly is formed from alternately stacked first and second heat radiating fins. The first and the second heat radiating fins each are provided on at least one lateral side with a projected point and a receded point, respectively, to thereby define an airflow guiding section on at least one longitudinal side of the heat radiating fin assembly. The airflow guiding section includes a first and a second airflow inlet, and a middle airflow inlet located between the first and the second airflow inlet. The heat radiating fin assembly can be associated with at least one heat pipe and a base to form a thermal module. The airflow guiding section enables widened airflow inlets, shortened airflow paths, reduced airflow pressure drop and flowing resistance, and upgraded cooling air flowing efficiency, so that the heat radiating fin assembly and the thermal module can provide excellent heat dissipating effect.

8 Claims, 11 Drawing Sheets

HEAT RADIATING FIN ASSEMBLY AND THERMAL MODULE FORMED THEREFROM

FIELD OF THE INVENTION

The present invention relates to a heat radiating fin assembly and a thermal module formed therefrom, and more particularly, to a heat radiating fin assembly and a thermal module formed therefrom capable of reducing cooling airflow pressure drop.

BACKGROUND OF THE INVENTION

With the progress in the technological fields, all kinds of electronic elements have constantly upgraded operating ability, which also brings increased heat produced by the electronic elements during the operation thereof. Therefore, people demand more and more for heat sinks with improved performance. For the purpose of providing enhanced heat dissipating function, most of the conventional heat sinks will adopt a heat radiating fin assembly consisting of a plurality of sequentially stacked heat radiating fins. Researches have been constantly conducted to develop improved heat radiating fins, and a high-performance heat sink has become one of the most important targets in the industrial field.

For example, among others, the central processing unit (CPU) of a computer produces the largest part of heat in the computer. The CPU would become slow in running when the heat produced and accumulated in the computer gradually increases. When the heat accumulated in the computer exceeds an allowable limit, the computer is subject to the danger of shutdown or even becoming seriously damaged. Moreover, to solve the problem of electromagnetic radiation, a case is used to enclose all the important computer components and elements therein. Therefore, it is very important to quickly dissipate the heat produced by the CPU and other heat-producing elements in the computer case.

Figure 1A:
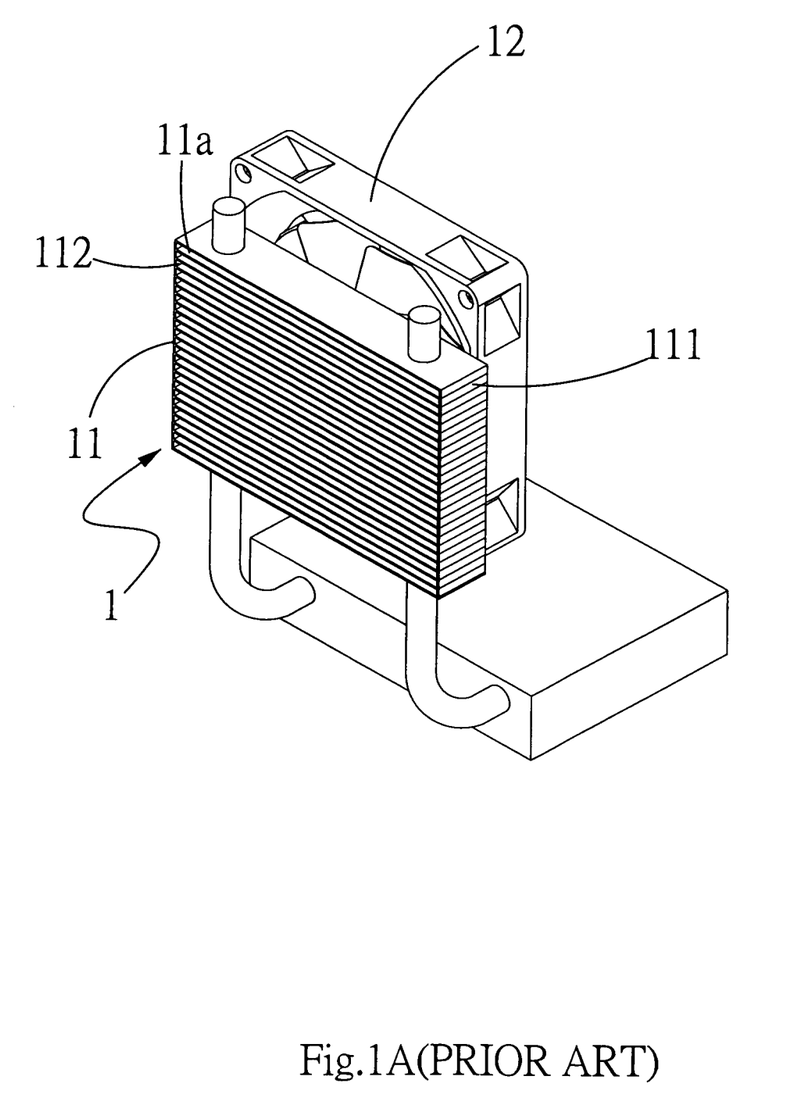
FIG. 1A is a perspective view of a conventional thermal module.
Figure 1B:
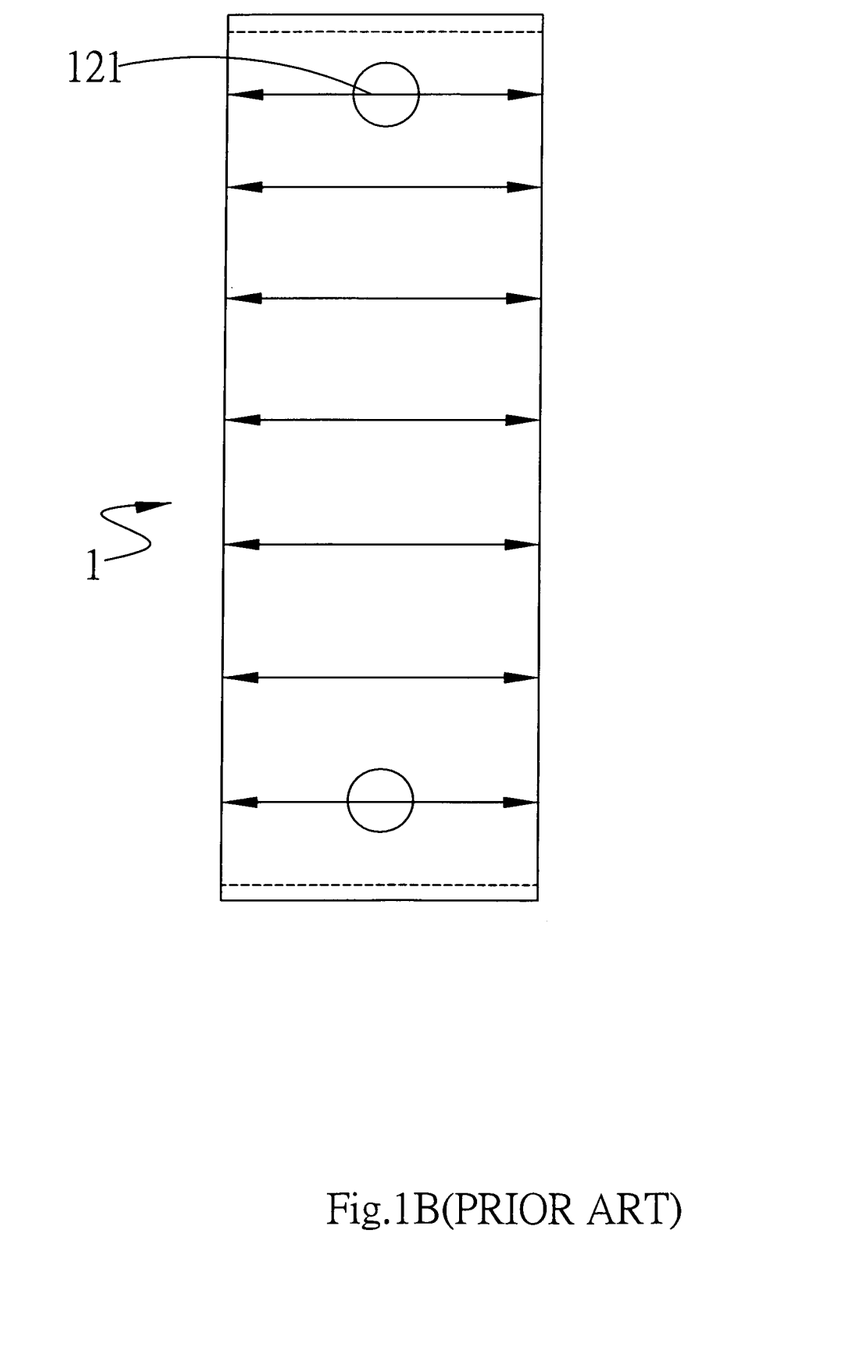
FIG. 1B is a top view of a conventional heat radiating fin assembly for the thermal module of FIG. 1A.

FIG. 1A is a perspective view of a conventional thermal module, and FIG. 1B is a top view of a heat radiating fin assembly 1 included in the thermal module. As shown, the conventional thermal module includes a heat radiating fin assembly 1, which is formed by a plurality of sequentially stacked heat radiating fins 11. Generally, each of the heat radiating fins 11 is a cut sheet metal material with two opposite ends being bent toward the same side to form two flanges 111. The flanges 111 on a higher heat radiating fin 11 are pressed against a top face 11a of an adjacent lower heat radiating fin 11, such that a heat dissipating space 112 is formed between any two adjacent heat radiating fins 11. A cooling fan 12 is mounted to one longitudinal side of the heat radiating fin assembly 1 to face toward the heat dissipating spaces 112. When the cooling fan operates, it produces and forces cooling airflows 121 into the heat dissipating spaces 112 to carry heat away from the heat radiating fin assembly 1. Since the heat radiating fin assembly 1 is formed from a plurality of closely stacked heat radiating fins 11, the heat dissipating spaces 112 formed between two adjacent heat radiating fins 11 are extremely small in height. Meanwhile, the heat dissipating spaces 112 each have a relatively large depth to define a quite long path for the cooling airflows 121. As a result, the cooling airflows flowing through the heat dissipating spaces 112 are subject to increased pressure drop and slowed flowing speed, which have adverse influences on the heat dissipating efficiency of the thermal module.

In brief, the conventional heat radiating fin assembly and the thermal module formed therefrom have the following disadvantages: (1) providing only very narrow heat dissipating spaces; (2) having poor heat-exchange efficiency; (3) providing only low heat dissipating efficiency; (4) having quiet long cooling airflow paths; and (5) subjecting the cooling airflow to increased pressure drop.

It is therefore tried by the inventor to develop an improved heat radiating fin assembly and a thermal module formed from such heat radiating fin assembly to overcome the drawbacks in the conventional heat radiating fin assembly and the thermal module formed therefrom.

SUMMARY OF THE INVENTION

A primary object of the present invention is to provide a heat radiating fin assembly capable of reducing cooling airflow pressure drop.

Another object of the present invention is to provide a thermal module formed from a heat radiating fin assembly capable of reducing cooling airflow pressure drop.

To achieve the above and other objects, the heat radiating fin assembly according to the present invention includes a plurality of alternately arranged and sequentially stacked first heat radiating fins and second heat radiating fins. Each of the first heat radiating fins is provided on at least one lateral side with a projected point, and each of the second heat radiating fins is provided on at least one lateral side with a receded point corresponding to the projected point on the first heat radiating fin. The projected points and the receded points together define an airflow guiding section on at least one longitudinal side of the heat radiating fin assembly. The airflow guiding section includes a first airflow inlet formed at an upper portion thereof, a second airflow inlet formed at a lower portion thereof, and a middle airflow inlet formed between the first and the second airflow inlet.

According to the present invention, the heat radiating fin assembly thereof can be associated with at least one heat pipe and a base to form a thermal module.

With the airflow guiding section, the heat radiating fin assembly and the thermal module of the present invention can have widened airflow inlets, shortened airflow paths, reduced airflow pressure drop and flowing resistance, and upgraded cooling air flowing efficiency, and can therefore provide excellent heat dissipating effect.

In brief, the present invention provides at least the following advantages: (1) having good heat dissipating efficiency; (2) enabling reduced cooling airflow pressure drop; (3) having high heat-exchange efficiency; (4) having simple structure; (5) preventing heat from stagnating around the heat radiating fin assembly; (6) allowing heat source to quickly diffuse into ambient environment; and (7) enabling upgraded cooling air flowing efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
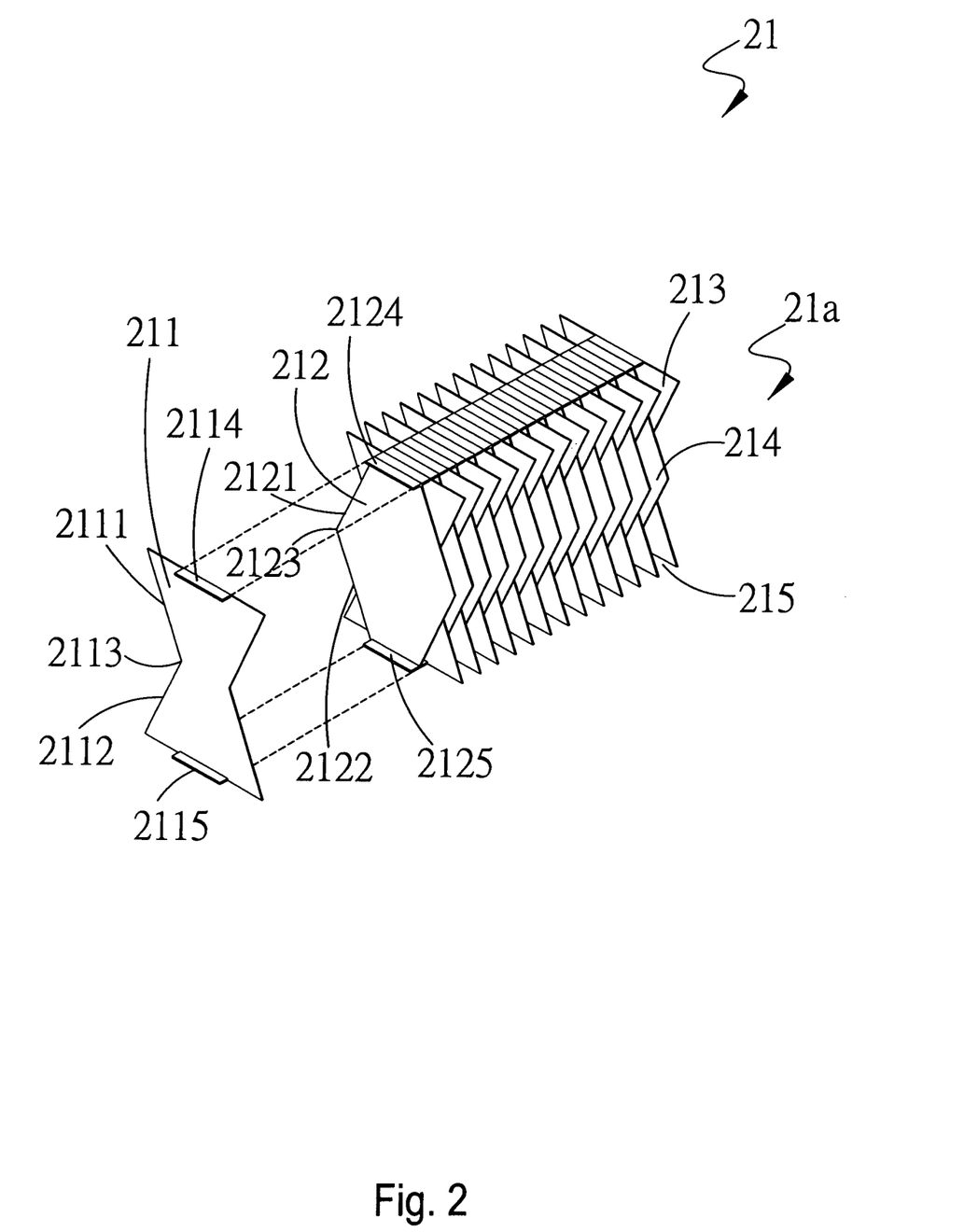
FIG. 2 is a partially exploded perspective view of a heat radiating fin assembly according to a first preferred embodiment of the present invention.
Figure 3A:
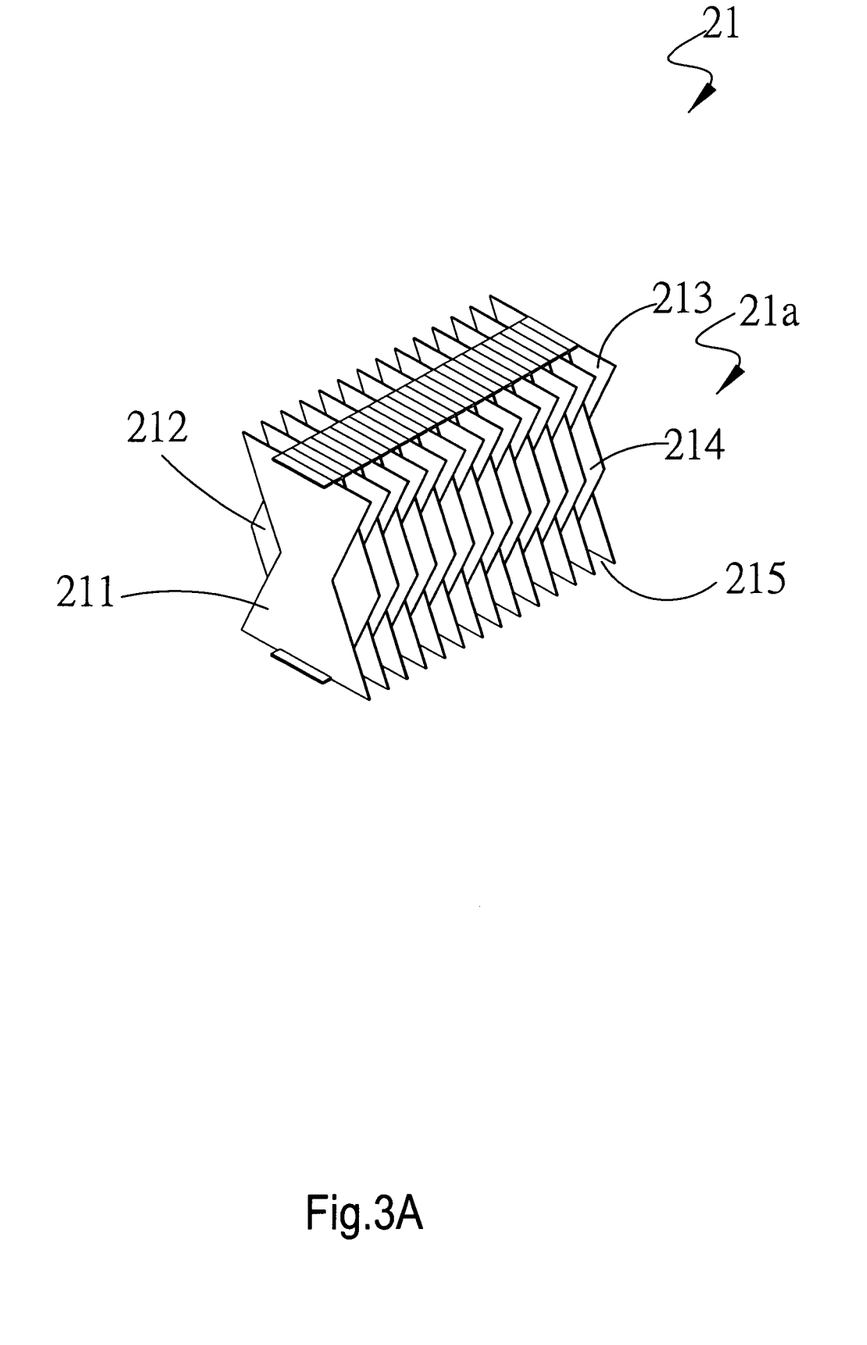
FIG. 3A is an assembled view of FIG. 2.

Please refer to FIGS. 2 and 3A, which are partially exploded and fully assembled perspective views, respectively, of a heat radiating fin assembly 21 according to a first preferred embodiment of the present invention. As shown, the heat radiating fin assembly 21 includes a plurality of sequentially stacked first heat radiating fins 212 and second heat radiating fins 211. The first and the second heat radiating fins 212, 211 are alternately arranged in the heat radiating fin assembly 21. Each of the first heat radiating fins 212 has an outward projected point 2123 formed on at least one lateral side thereof, and each of the second heat radiating fins 211 has an inward receded point 2113 formed on at least one lateral side corresponding to the lateral side of the first heat radiating fin 212 having the projected point 2123 formed thereon, such that the lateral sides of the first and the second heat radiating fins 212, 211 having the projected points 2123 and the receded points 2113, respectively, together define a airflow guiding section 21a on the heat radiating fin assembly 21. The airflow guiding section 21a can be defined on at least one of two longitudinal sides of the heat radiating fin assembly 21. When viewing in front of the longitudinal side of the heat radiating fin assembly 21 having the airflow guiding section 21a defined thereat, it can be seen that a first airflow inlet 213 is formed at an upper portion of the airflow guiding section 21a, a second airflow inlet 215 is formed at a lower portion of the airflow guiding section 21a, and a middle airflow inlet 214 is located between the first and the second airflow inlet 213, 215.

Figure 3B:
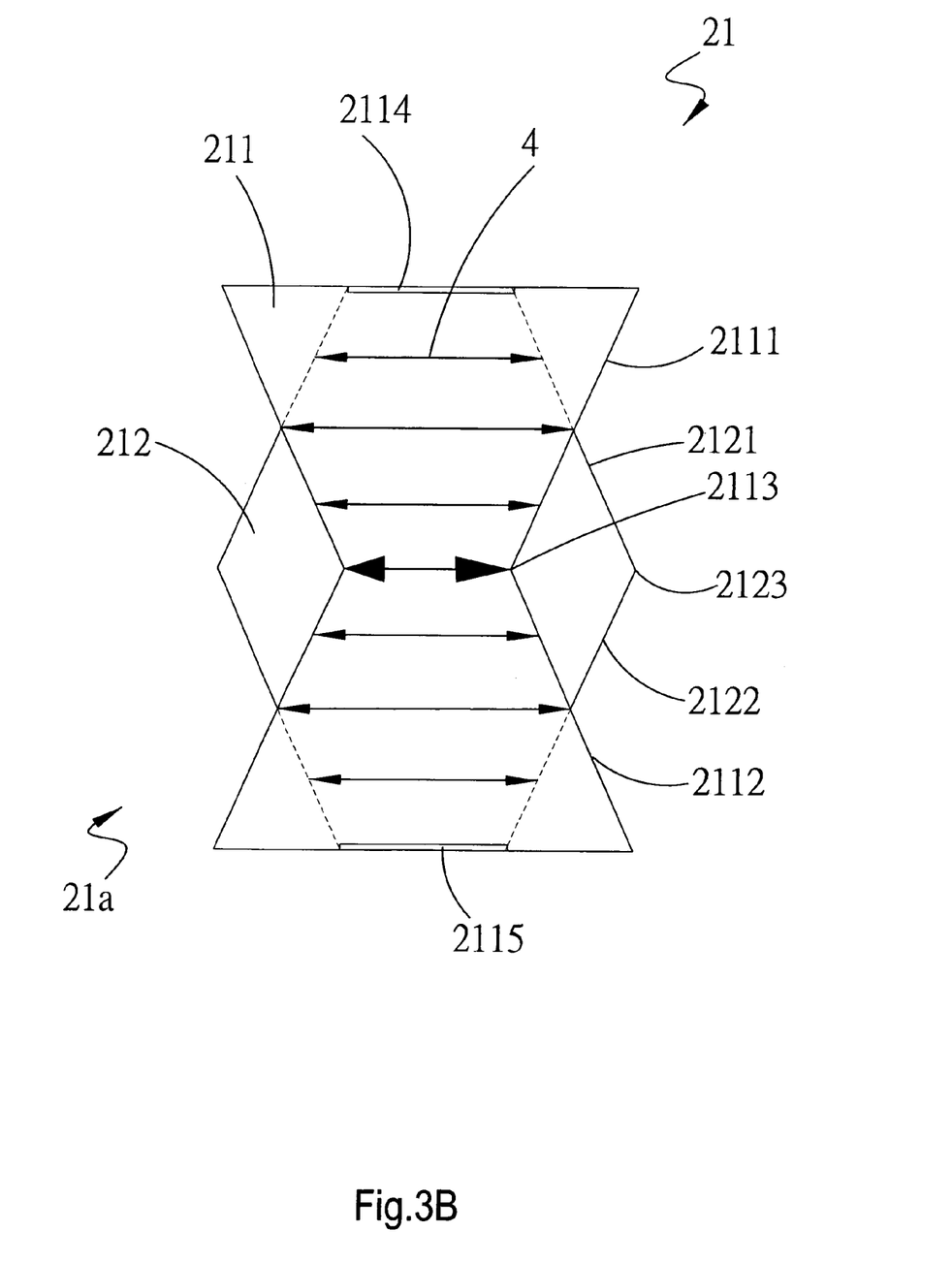
FIG. 3B is a front view of the heat radiating fin assembly of FIG. 3A.
Figure 4:
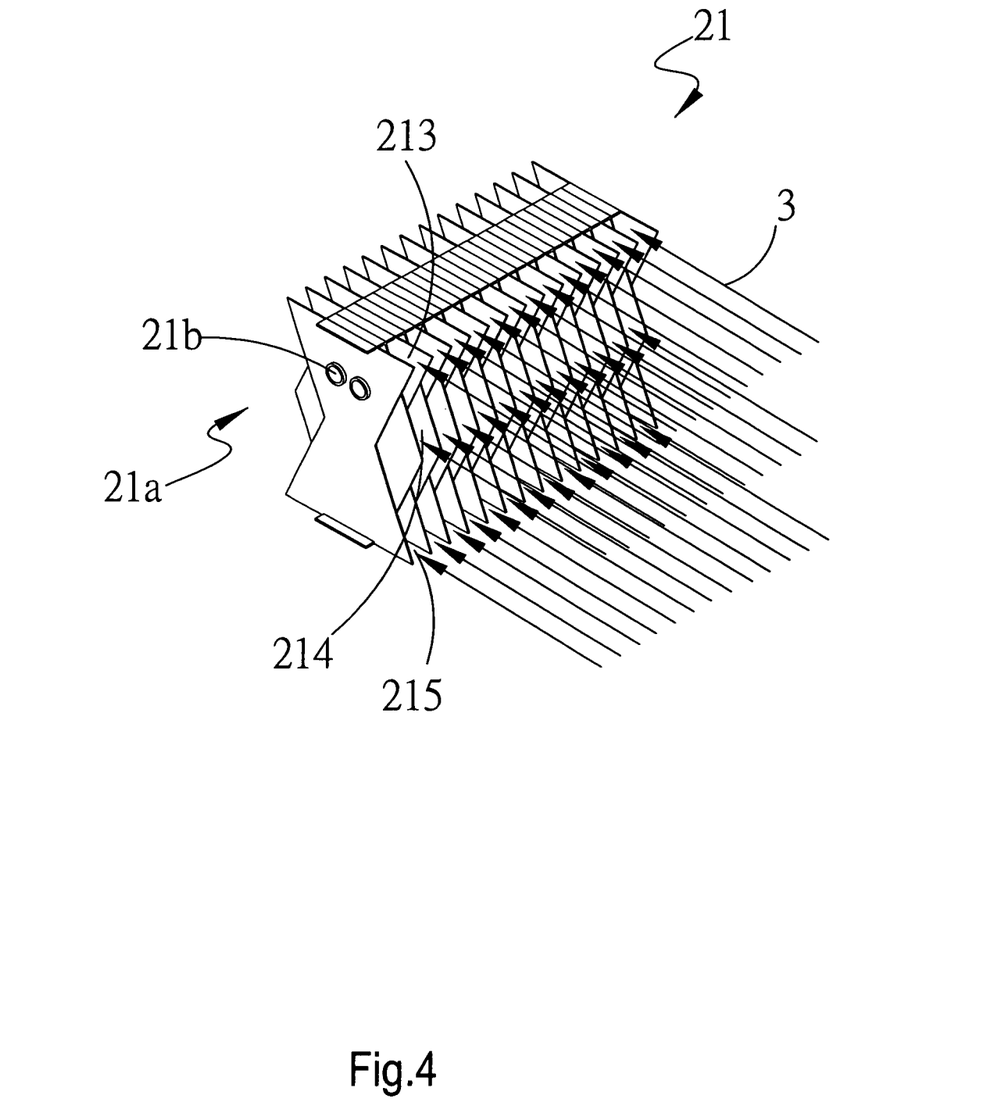
FIG. 4 is a perspective view of a heat radiating fin assembly according to a second preferred embodiment of the present invention.

FIG. 3B is a front view of the heat radiating fin assembly 21 of FIG. 3A. Please refer to FIGS. 2, 3A, and 3B at the same time. Each of the first heat radiating fins 212 has a first slant lateral edge 2121 and a second slant lateral edge 2122 that extend to join at the projected point 2123; and each of the second heat radiating fins 211 has a third slant lateral edge 2111 and a fourth slant lateral edge 2112 that extend to join at the receded point 2113. Moreover, each of the first heat radiating fins 212 has two opposite transverse edges being bent toward the same side to form a first flange 2124 and a second flange 2125, and each of the second heat radiating fins 211 has two opposite transverse edges being bent toward the same side to form a third flange 2114 and a fourth flange 2115, as can be seen in FIG. 2. Therefore, when a plurality of first and second heat radiating fins 212, 211 are sequentially stacked and alternately arranged to form the heat radiating fin assembly 21, the first and second slant lateral edges 2121, 2122 are staggered with respect to the third and fourth slant lateral edges 2111, 2112, and the projected points 2123 are staggered with respect to the receded points 2113 to thereby define the airflow guiding section 21a on at least one of two longitudinal sides of the heat radiating fin assembly 21. The airflow guiding section 21a includes a first airflow inlet 213, a second airflow inlet 215, and a middle airflow inlet 214 located between the first and the second airflow inlet 213, 215. With the airflow guiding section 21a being defined on one or both of two longitudinal sides of the heat radiating fin assembly 21, the heat radiating fin assembly 21 provides shortened airflow paths 4 therein. As can be seen in FIG. 4, the first and the second airflow inlet 213, 215 and the middle airflow inlet 214 provide relatively large spaces for cooling airflows 3 to flow into the heat radiating fin assembly 21 with reduced pressure drop and in largely increased flowing efficiency to enable upgraded heat dissipating effect.

As can be seen from FIG. 4, the heat radiating fin assembly 21 can be further provided with at least one through hole 21b for a heat pipe (not shown) to extend therethrough. The first and the second airflow inlet 213, 215 and the middle airflow inlet 214 at the airflow guiding section 21a provide relatively large spaces for an increased volume of cooling airflows 3 to flow into and through the heat radiating fin assembly 2 with largely reduced pressure drop and largely increased flowing efficiency.

Figure 5:
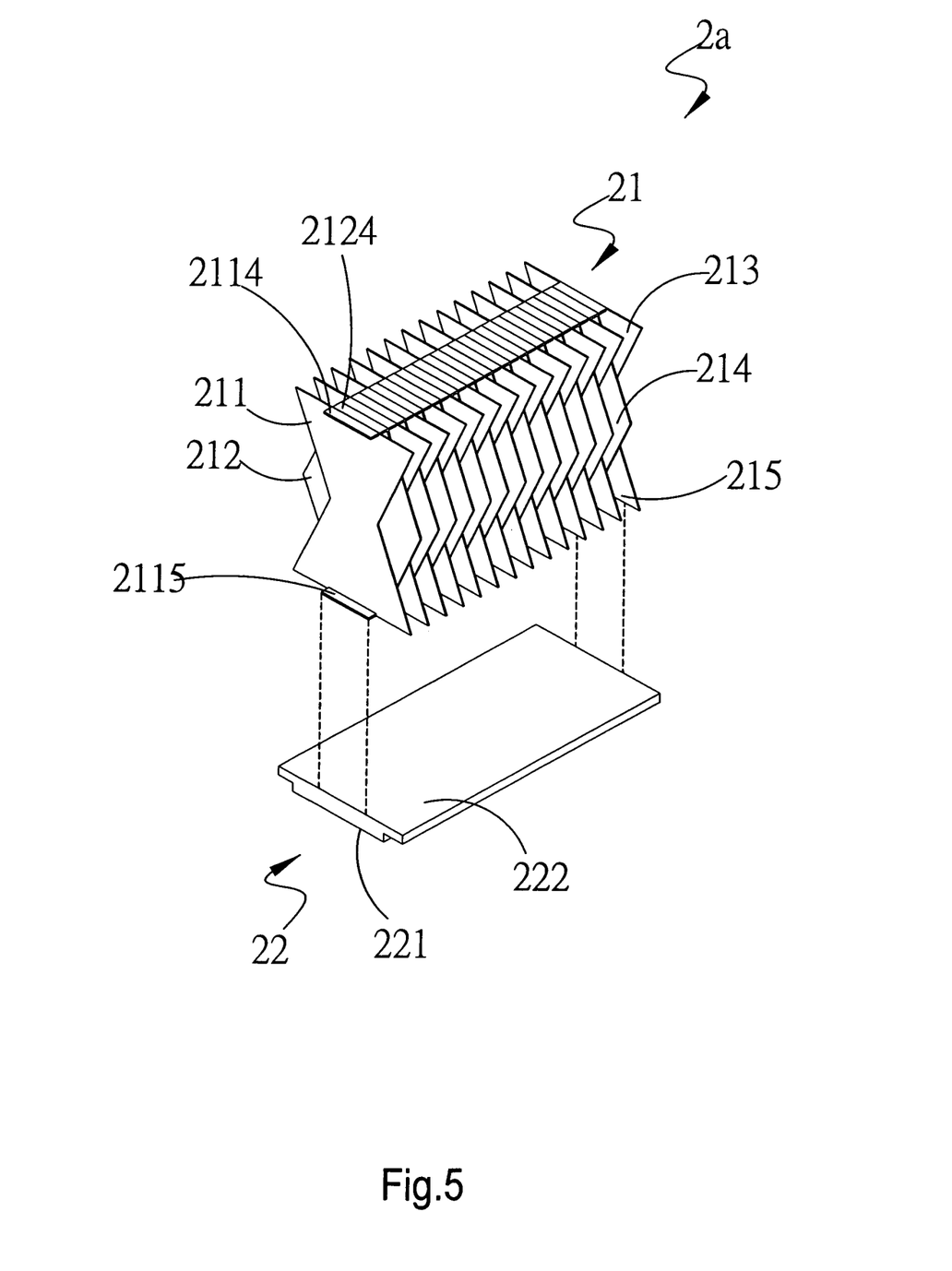
FIG. 5 is a partially exploded perspective view of a heat sink according to an embodiment of the present invention.
Figure 6:
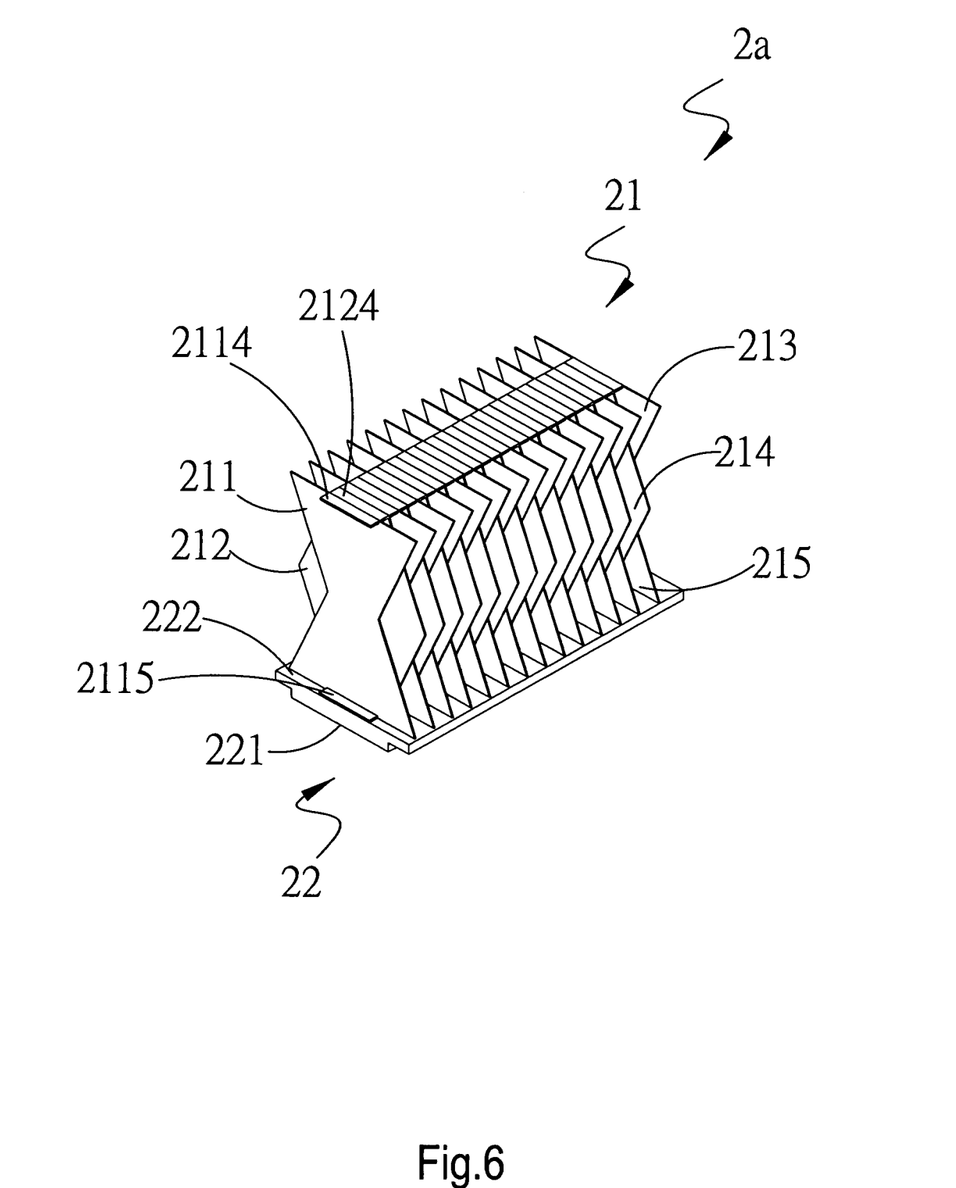
FIG. 6 is an assembled view of FIG. 5.

FIGS. 5 and 6 are partially exploded and fully assembly perspective views, respectively, of a heat sink 2a of the present invention formed from the heat radiating fin assembly 21 and a base 22. The heat radiating fin assembly 21 is assembled from a plurality of alternately arranged and sequentially stacked first heat radiating fins 212 and second heat radiating fins 211. Each of the first heat radiating fins 212 is provided at two opposite transverse edges with a first and a second flange 2124, 2125 (see FIG. 2); and each of the second heat radiating fins 211 is provided at two opposite transverse edges with a third and a fourth flange 2114, 2115. The base 22 includes a first face 221 for contacting with a heat-producing source (not shown) to conduct heat produced by the latter, and a second face 222 opposite to the first face 221 for selectively contacting with the first and the third flanges 2124, 2114 or the second and the fourth flanges 2125, 2115 to transfer the heat from the base 22 to the heat radiating fin assembly 21.

Figure 7:
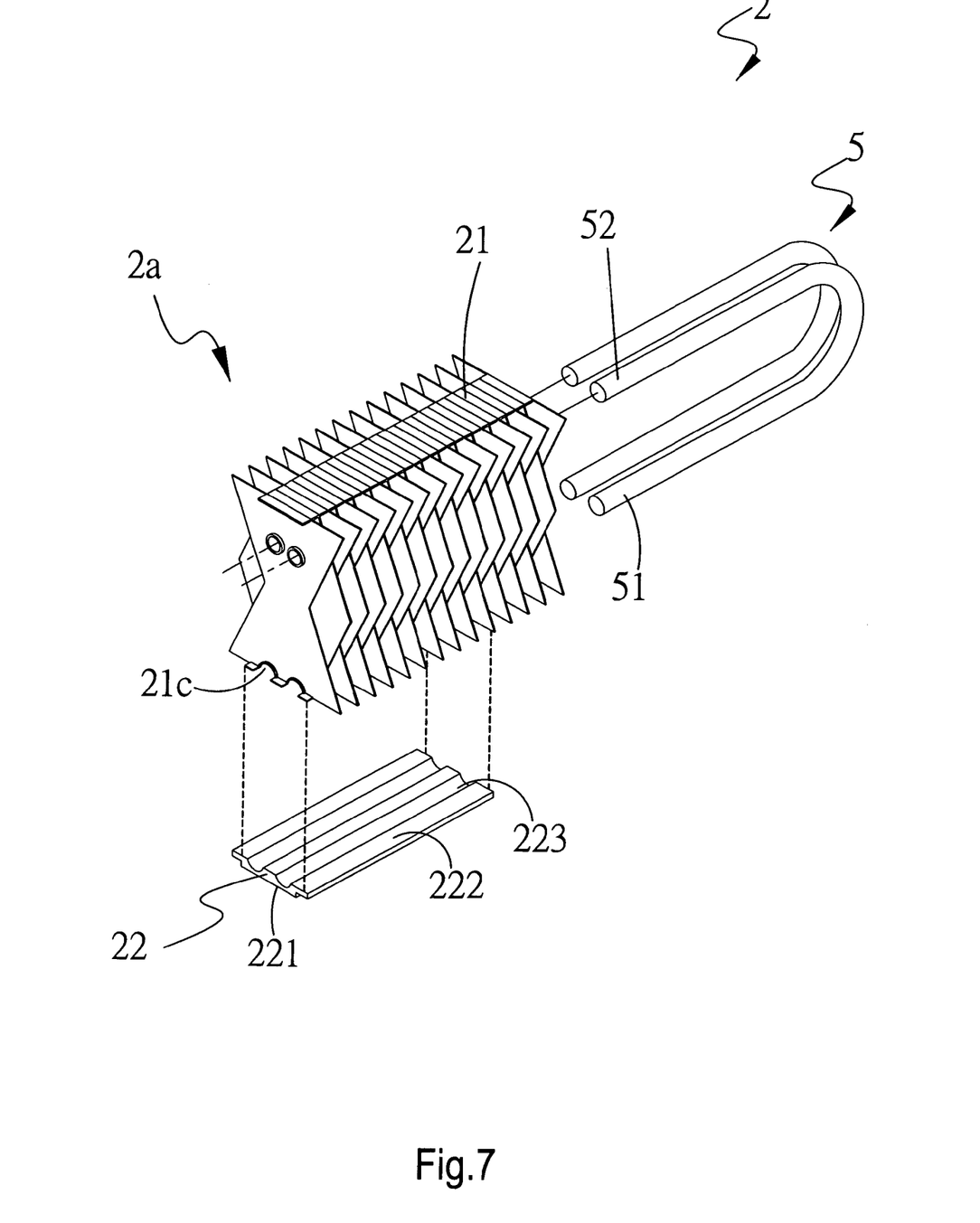
FIG. 7 is a partially exploded perspective view of a thermal module according to a first embodiment of the present invention.
Figure 8:
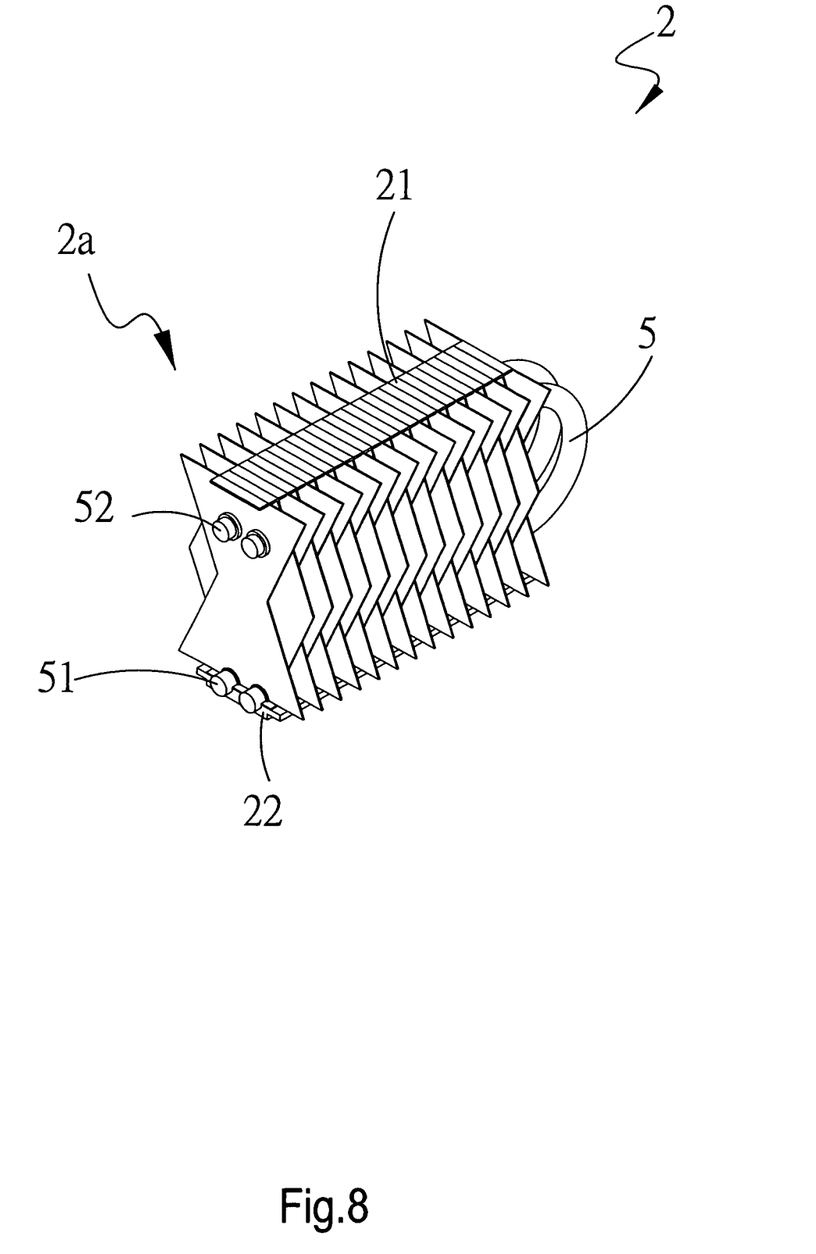
FIG. 8 is an assembled view of FIG. 7.

FIGS. 7 and 8 are partially exploded and fully assembled perspective views, respectively, of a thermal module 2 according to a first embodiment of the present invention. In the illustrated first embodiment, the thermal module 2 is formed from the heat sink 2a and a pair of heat pipes 5. As shown, the heat pipes 5 each have at least one heat conducting end 51 and at least one heat dissipating end 52. The heat dissipating ends of the heat pipes 5 are extended through the heat radiating fin assembly 21. The heat radiating fin assembly 21 in the illustrated first embodiment of the thermal module 2 is provided at the transverse edges and the flanges of the first and second heat radiating fins 212, 211 in contact with the second face 222 of the base 22 with two rows of notches 21c. Meanwhile, the base 22 is provided on the second face 222 with two grooves 223 corresponding to the two rows of notches 21c, so that the heat conducting ends 51 of the two heat pipes 5 can be received in and fixedly set between the two rows of notches 21c and the two grooves 223.

Figure 9:
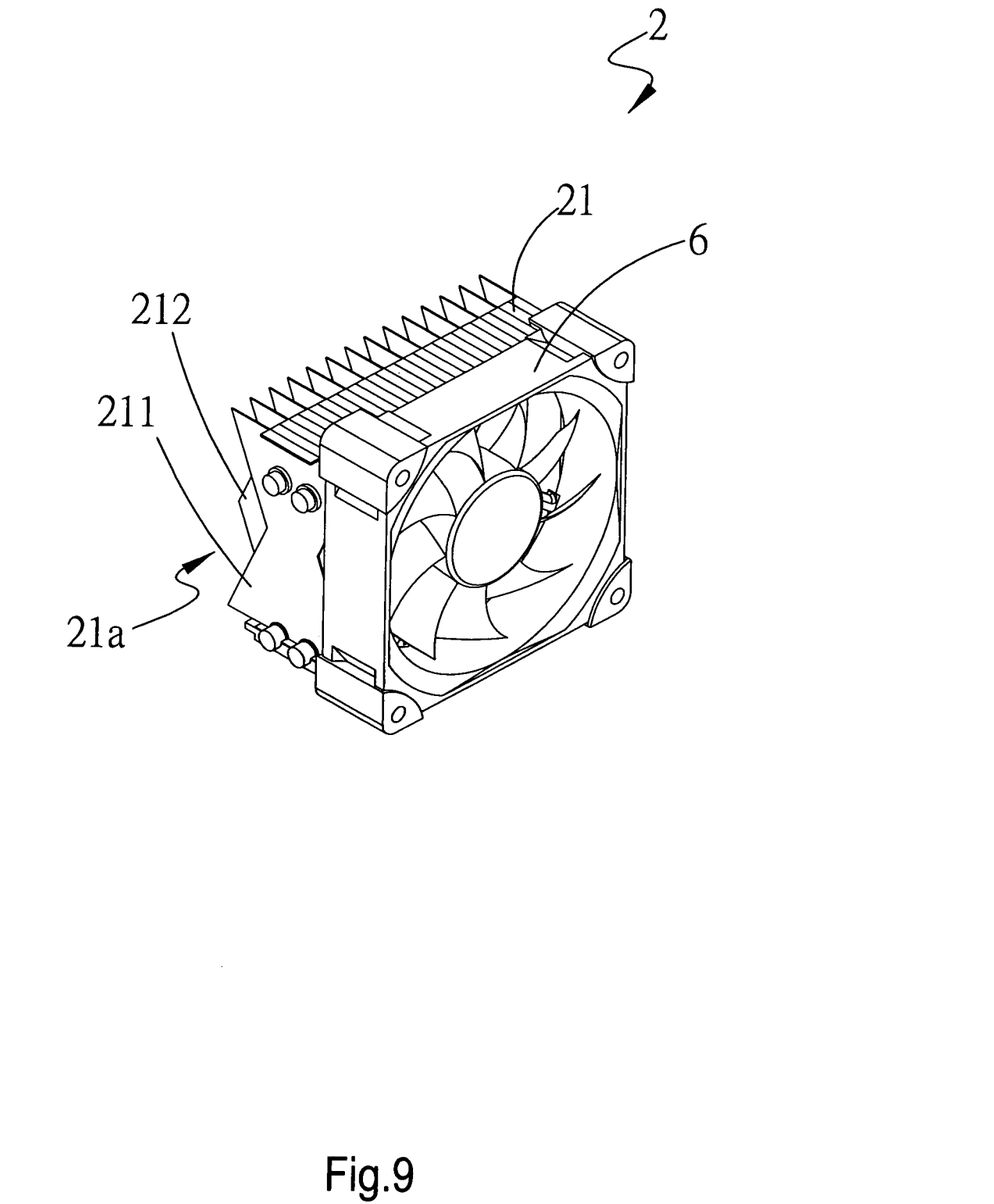
FIG. 9 is a perspective view of a thermal module according to a second embodiment of the present invention.

FIG. 9 is a perspective view of a thermal module 2 according to a second embodiment of the present invention. The thermal module 2 in the second embodiment is similar to that in the first embodiment, except for a cooling fan 6 being arranged at one longitudinal side of the heat radiating fin assembly 21 to face toward the airflow guiding section 21a defined thereat. When the heat radiating fin assembly 21 has two airflow guiding sections 21a separately defined at two longitudinal sides thereof, the cooling fan 7 can be selectively arranged at any one of the two longitudinal sides to face toward the airflow guiding section 21a defined thereat.

Further, in addition to alternately arranging the first and the second heat radiating fins 212, 211 one by one, so that the first and the second heat radiating fins 212, 211 are the same in number in the heat radiating fin assembly 21, it is also acceptable to arrange more than one first heat radiating fin 212 between two adjacent second heat radiating fins 211, or to arrange more than one second heat radiating fin 211 between two adjacent first heat radiating fins 212, so that the first and the second heat radiating fins 212, 211 are not the same in number.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat radiating fin assembly, comprising:
   a plurality of spaced alternately arranged and sequentially stacked first heat radiating fins and second heat radiating fins;
   each of the first radiating fins having a first flange and opposite second flange, a pair of first slant lateral edges extending from a first side of the first flange and a second side of the first flange, respectively; a pair of second slant lateral edges extending from a first side of the second flange and a second side of the second flange, respectively; each first slant lateral edge and each second slant lateral edge extend to join at a projection point, formed on a first lateral side and opposite second lateral side of the first radiating fin, the first flange, the second flange, the first pair of slant lateral edges, and the second pair of slant lateral edges, define the periphery of each of the first radiating fins,
   each of the second heat radiating fins having a first transverse edge and an opposite second transverse edge, a portion of the first transverse edge forms a third flange and a portion of the second transverse edge forms a fourth flange, a pair of third slant lateral edges extending from a first side of the first transverse edge and a second side of the first transverse edge, respectively; a pair of fourth slant lateral edges extending from a first side of the second transverse edge and a second side of the second transverse edge, respectively; each third slant lateral edge and each fourth slant lateral edge extend to join at a receded point, formed on the first lateral side and opposite second lateral side of the second fin, the first transverse edge, the second transverse edge, the third pair of slant lateral edges, and the fourth pair of slant lateral edges, define the periphery of each of the second radiating fins,
   the first and second lateral side of the first fin and first and second lateral sides of the second fin correspond such that the projection point and the receded point are alternately aligned together such that the projected points correspond to the receded points in alternate alignment to define an airflow guiding section in the heat radiating fin assembly with the first and second lateral sides of each of the first and second radiating fins having oppositely angled edges for encountering air flow in a manner that provides a wind shear effect;
   the airflow guiding section being defined on each longitudinal side, of the heat radiating fin assembly, and including a first airflow inlet formed at an upper portion thereof, a second airflow inlet formed at a lower portion thereof, and a middle airflow inlet formed between the and the second airflow inlet.

2. The heat radiating fin assembly as claimed in claim 1, further comprising at least one longitudinally extended through hole.

3. The heat radiating fin assembly as claimed in claim 1, wherein the first heat radiating fins each have two opposite transverse edges being bent toward the same side to provide a first and a second flange.

4. The heat radiating fin assembly as claimed in claim 1, wherein the second heat radiating fins each have two opposite transverse edges being bent toward the same side to provide a third and a fourth flange.

5. The heat radiating fin assembly as claimed in claim 1, wherein the airflow guiding section is defined on each of two longitudinal sides of the heat radiating fin assembly.

6. The heat radiating fin assembly as claimed in claim 1, wherein the first and the second heat radiating fins are alternately arranged one by one, so that the first and the second heat radiating fins are the same in number.

7. The heat radiating fin assembly as claimed in claim 1, wherein the first and the second heat radiating fins are alternately arranged with more than one first heat radiating fin arranged between any two adjacent second heat radiating fins or more than one second heat radiating fin arranged between any two adjacent first heat radiating fins, so that the first and the second heat radiating fins are not the same in number.

8. The heat radiating fin assembly as claimed in claim 2, comprising a plurality of longitudinally extended through holes.

* * * * *